United States Patent [19]

Aulich et al.

[11] 4,298,245
[45] Nov. 3, 1981

[54] WAVEGUIDES WITH A LOW BIREFRINGENCE

[75] Inventors: Hubert Aulich; Alfred Papp, both of Munich, Fed. Rep. of Germany

[73] Assignee: Siemens Aktiengesellschaft, Berlin & Munich, Fed. Rep. of Germany

[21] Appl. No.: 64,045

[22] Filed: Aug. 6, 1979

[30] Foreign Application Priority Data

Sep. 21, 1978 [DE] Fed. Rep. of Germany ....... 2841162

[51] Int. Cl.$^3$ .................... G02B 5/172; G02F 1/09
[52] U.S. Cl. ........................ 350/96.29; 350/96.30; 350/376; 324/96
[58] Field of Search ............ 350/96.29, 96.30, 96.34, 350/151, 375, 376, 378; 324/96

[56] References Cited

U.S. PATENT DOCUMENTS

| | | | |
|---|---|---|---|
| 3,746,983 | 7/1973 | Renz | 350/96.29 |
| 3,756,690 | 9/1973 | Borrelli et al. | 350/96.29 |
| 3,810,013 | 5/1974 | Müller | 324/96 |
| 4,167,305 | 9/1979 | Ichiba et al. | 350/96.34 |

OTHER PUBLICATIONS

Grabmaier et al., "Preparation & Properties of Low-Loss Optical Fibers with a Fused Silica Core & Plastic Cladding", *Siemens F & E Report*, vol. 6, No. 5, 1972, pp. 314–319.

Blyler et al., "Low-Loss, Polymer-Clad Silica Fibers", Bell Laboratories, Murray Hill, N.J., Feb. 1975.

Kaiser et al., "Low-Loss FEP-Clad Silica Fibers", Applied Optics, vol. 14, No. 1, Jan. 1975, pp. 156–162.

*Primary Examiner*—Stewart J. Levy
*Attorney, Agent, or Firm*—Hill, Van Santen, Steadman, Chiara & Simpson

[57] ABSTRACT

The present invention is directed to an improvement in a magneto-optical device having a light waveguide for conducting light characterized by the light waveguide being a cladded optical fiber having a core of quartz glass and a cladding of synthetic material. This improvement provides an improved method of using the magneto-optical device by suppressing distortions of polarized light by reducing birefringence in the waveguide by using a waveguide comprising an optical fiber having a quartz glass core and a cladding of synthetic material.

10 Claims, 2 Drawing Figures

WAVEGUIDES WITH A LOW BIREFRINGENCE

BACKGROUND OF THE INVENTION

The present invention is directed to a method of reducing distorsions in a light waveguide of a magneto-optical device for providing a magneto-optical device having a light waveguide with a low birefringence.

For magneto-optical devices, it is necessary to have light waveguides in which the polarization relationship of the guided light are falsified or distorted as little as possible and particularly a waveguide which avoids birefringence. A magneto-optical device of this sort is, for example, an optical measuring transformer or transducer which is a device for measurement of strong magnetic fields. This is accomplished by a polarized light being conveyed by a light waveguide and guided through a magnetic field. For the measurement of the field, the influence of the magnetic field on the polarization level of the light is determined. Another example of a magneto-optical device is a magneto-optical gyroscope. Fiber optical waveguides with birefringence will disturb the information contained in the plane polarized beam and, therefore, cause false measurements, in particular, if the birefringence is temperature dependent.

Previously, for the direction of the light through such a magneto-optical device, light waveguides of a cylindrical glass jacket or tube are used and contained a liquid which guided the light. Because of the isotropy of the liquid, no privileged directions were formed in this type of light guide and thus the polarization relationship of the light was not disturbed. Nevertheless, these liquid light guides have other disadvantages. For example, they require a more expensive and involved system of construction and are strongly temperature dependent with regard to their mechanical and their magneto-optical characteristics.

Usual fiber optical waveguides, which consist of a glass core and a glass cladding or jacket, which glass cladding has a lower index of refraction than the glass core, are not suitable for magneto-optical uses. In particular, these glass fiber optical waveguides have a significant birefringence. The reason for this birefringence is still not well explained. In the usual fiber optical waveguide, the fiber core generally consists of quartz glass which has been doped with a $GeO_2$ or $P_2O_5$. Fluctuations in the concentration of the doping material can, for example, lead to tensions or stresses which negatively influence the polarization characteristic of the fiber. So, for example, in the case of the usual commercial $GeO_2$ doped quartz glass fibers, a high depolarization of the light beam has been observed. Also, for example, the birefringence is all the more stronger when the cross section of the glass core deviates from a circular form. Further, large differences in the thermal coefficient of expansion of the core material and the cladding material leads to stresses and to depolarization.

SUMMARY OF THE INVENTION

The present invention is based on the task of providing a light waveguide for a magneto-optical device which waveguide is simple to both manufacture and handle, has the characteristics which are largely temperature independent, and which waveguide distorts the polarization behavior of the guided light as little as possible. According to the present invention, these tasks are accomplished in a magneto-optical device having a light waveguide for conducting light the improvement comprising said light waveguide being a cladded optical fiber having a core of quartz glass and a cladding of synthetic material so that the light waveguide has a low birefringence. The present invention is also directed to an improvement in a method of using the magneto-optical device which method including passing the polarized light through a waveguide and detecting a polarized light passing through the waveguide. The improvement comprising suppressing the distorsions of the polarized light by reducing the birefringence in the waveguide by utilizing a waveguide comprising an optical fiber having the quartz glass core and a cladding of synthetic material.

Light waveguides, which have a quartz glass core and a cladding of synthetic material, are known per se and discussed in Siemens Forschungs - und Entwicklungs Berichte, Vol. 6, 1977, pp. 314-319. The core consists of a highly pure birefringence-free glass of $SiO_2$ (quartz glass) with the cladding being of a highly transparent synthetic material having an index of refraction which lies below the index of refraction of the quartz glass. The cladding material in this part of the literature are usually commercial synthetic materials, for example polyvinylidene-fluoride, which is sold under the tradename, KYNAR; polyperfluoro-ethylene-propylene; polyfluoroalkyl-methacrylate, and polymethyl-siloxane also known as polysiloxane. The manufacture of the light waveguide is accomplished by a glass fiber being drawn to a diameter of approximately 100-200 $\mu$m and then being coated with a synthetic material by passing the drawn fiber directly through a bath of the synthetic material. The characteristics of the synthetic material cladded quartz glass core resembles the characteristics of traditional glass cladded fiber optical waveguides. Since the core consists of a one-component glass, no concentration and fluctuations occur nor do the depolarization appearances connected therewith. Suprisingly, these fiber optical waveguides show no birefringence, which is worthy of mention. Although the characteristics of synthetics are known to be strongly temperature dependent, the transmission characters of the core are practically not influenced by temperature dependence of the cladding material. This might at least particularly come from the fact that the synthetic material is very soft and thus exercises no mechanical tensions or stresses upon the core. The quartz glass, which is used, is insofar as no mechanical stresses or tensions appear largely free of the double refraction or birefringence. During the embedding of the synthetic cladded light fibers, the mechanical tensions, which appear in the core and are brought forth by the core itself which in themselves also would be temperature dependent, surprisingly cause no double refraction which is worthy of mention. This at least applies for the core cross section, which are generally used in the case of the fiber optical guides.

DESCRIPTION OF THE PREFERRED EMBODIMENTS

Figure 1:
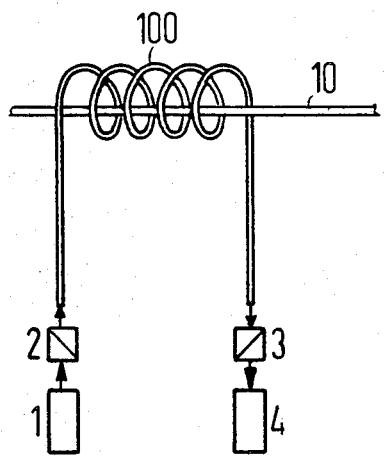
FIG. 1 shows a magneto-optical measuring transformer in accordance with the present invention.

The principles of the present invention are particularly useful in a magneto-optical device such as the magneto-optical measuring transformer illustrated in FIG. 1. The magneto-optical device has a light source 1, which projects a beam of light through a polarizer 2. The light source 1 is preferably a laser so that the light passing through the polarizer 2 is polarized and monochromatic. This polarized light is projected into one end of a fiber optical waveguide 100, which is wound in a form of a helix or coil in an area of a current conductor 10. Because of the magnetic field generated by the current in the conductor 10, the polarization direction of the light beam will be twisted or rotated. The light beam as it passes through the waveguide 100 is directed to an analyzer 3 and into a detector 4. The polarization direction of the analyzer is arranged to extend perpendicular to the direction of the polarizer 2. Thus, because of the rotation or twisting of the direction of the polarization of the light beam due to the magnetic field created by the current in the conductor 10, the intensity of the light, which is passed by the analyzer 3 and is measured by the detector 4, will be dependent upon the amount of twisting or rotation and thus provides a measurement of the high voltage current in the conductor 10.

Figure 2:
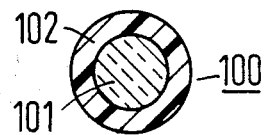
FIG. 2 is a cross section of an optical fiber in accordance with the present invention.

As best illustrated in FIG. 2, the waveguide 100 is a fiber optical waveguide having a core 101 of quartz glass which is surrounded by a cladding layer of synthetic material 102. The waveguide 100 can be made by a rod of molten high purities $SiO_2$ of approximately 8 mm diameter being fastened with one end in a resistance furnace or induction furnace and the other end being drawn out into a fiber of approximately 120 μm diameter. After leaving the furnace, the drawn fiber is then passed directly through a container containing a liquid polysiloxane, which will then form a layer of approximately 30 μm thick as the cladding layer. The coated fiber is then heated in a drying furnace in order to obtain a good adhesion between the cladding 102 and the core 101.

The optical waveguide 100 will display high mechanical stability and optical transmission characteristics, which approach the characteristics of customary glass fiber type of optical waveguides. The birefringence or temperature dependent influences upon the state of polarization of the light passing in the optical waveguide will be practically not observable.

Although various minor modifications may be suggested by those versed in the art, it should be understood that we wish to embody within the scope of the patent granted hereon, all such modifications as reasonably and properly come within the scope of our contribution to the art.

We claim:

1. In a magneto-optical transducer having a light waveguide for conducting light which waveguide is wound into a coil, and having means for projecting polarized light into at least one end of the waveguide and means for measuring the amount of rotation in the polarized light leaving at least one end of the waveguide, the improvement comprising said light waveguide being a cladded optical fiber having a core of quartz glass and a cladding of synthetic material so that the light waveguide even with mechanical stresses from being wound in a coil has no noticeable birefringence.

2. In a magneto-optical transducer according to claim 1, wherein the synthetic material of the cladding is a polyvinylidene-fluoride.

3. In a magneto-optical transducer according to claim 1, wherein the synthetic material of the cladding is a polyperfluoro-ethylene-propylene.

4. In a magneto-optical transducer according to claim 1, wherein the synthetic material of the cladding is a polyfluoro-alkyl-methacrylate.

5. In a magneto-optical transducer according to claim 1, wherein the synthetic material of the cladding is a polymethyl-siloxane.

6. In a method of using a magneto-optical transducer, said method including passing a polarized light through a waveguide which is wound into a coil and detecting the polarized light passing through the waveguide the improvement comprising suppressing distorsions of the polarized light by reducing birefringence in the wound waveguide by utilizing a waveguide comprising an optical fiber having a quartz glass core and a cladding of synthetic material.

7. In a method according to claim 6, wherein the synthetic material of the cladding is a polyvinylidene-fluoride.

8. In a method according to claim 6, wherein the synthetic material of the cladding is a polyperfluoro-ethylene-propylene.

9. In a method according to claim 6, wherein the synthetic material of the cladding is a polyfluoroalkyl-methacrylate.

10. In a method according to claim 6, wherein the synthetic material of the cladding is a polymethyl-siloxane.

* * * * *